United States Patent
Tabara

[11] Patent Number: 6,008,132
[45] Date of Patent: *Dec. 28, 1999

[54] DRY ETCHING SUPPRESSING FORMATION OF NOTCH

[75] Inventor: Suguru Tabara, Hamamatsu, Japan

[73] Assignee: Yamaha Corporation, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/738,100

[22] Filed: Oct. 25, 1996

[30] Foreign Application Priority Data

Oct. 26, 1995 [JP] Japan .................................. 7-302014

[51] Int. Cl.$^6$ .............................................. H01L 21/3065
[52] U.S. Cl. .......................... 438/714; 438/711; 438/712; 438/720; 438/728; 438/734; 216/67; 216/68; 216/69; 216/72; 216/77; 156/345
[58] Field of Search ...................... 156/345 PC, 345 MC; 216/63, 67, 68, 69, 41, 72, 77; 438/706, 711, 712, 714, 720, 728, 734

[56] References Cited

U.S. PATENT DOCUMENTS

| | | | |
|---|---|---|---|
| 4,547,260 | 10/1985 | Takada et al. ....................... | 438/734 X |
| 4,729,815 | 3/1988 | Leung ...................................... | 438/714 |
| 4,849,376 | 7/1989 | Balzan et al. ....................... | 438/734 X |
| 5,013,400 | 5/1991 | Kurasaki et al. .................... | 438/734 X |
| 5,164,034 | 11/1992 | Arai et al. ........................... | 156/345 PC |
| 5,164,330 | 11/1992 | Davis et al. ........................ | 438/714 X |
| 5,308,431 | 5/1994 | Maher et al. ...................... | 156/345 PC |
| 5,318,667 | 6/1994 | Kumihashi et al. .................. | 216/67 X |
| 5,397,431 | 3/1995 | Kadomura ............................... | 438/695 |
| 5,494,522 | 2/1996 | Mariya et al. ................. | 156/345 PC X |
| 5,512,130 | 4/1996 | Barna et al. ........................... | 216/67 X |
| 5,637,190 | 6/1997 | Liao ...................................... | 216/67 X |
| 5,651,856 | 7/1997 | Keller et al. ........................ | 216/67 X |
| 5,667,630 | 9/1997 | Lo ......................................... | 216/67 X |
| 5,827,437 | 10/1998 | Yang et al. .............................. | 216/67 |

FOREIGN PATENT DOCUMENTS

| | | | |
|---|---|---|---|
| 60-142519 | 7/1985 | Japan .......................... | H01L 21/302 |
| 4345026 | 12/1992 | Japan .......................... | H01L 21/302 |
| 7-226303 | 8/1995 | Japan ......................... | H01L 21/3065 |

OTHER PUBLICATIONS

Suguru TABARA, "Notch Profile Defect in Aluminum Alloy Etching Using High–Density Plasma", Jpn. Appl. Phys., vol. 35, (1996) pp. 2456–2462.

D. Takehara, et al., "Characteristics of n$^+$poly–Si Etching by Helicon Wave Plasma", 1993 Dry Process Symposium, Nov. 1–2, 1993, Japan, pp. 51–54.

T. Nozawa, et al., "The Electron Charging Effects of Plasma on Notch Profile Defects", 1994 Dry Process Symposium, Japan, pp. 37–41.

N. Fujiwara, et al., "Profile Control of poly–Si Etching in ECR Plasma", *1994 Dry Process Symposium*, Japan. pp. 31–36.

N. Fujiwara, et al., "Effect of ECR Plasma Expansion on Etching Characteristics in a Flared Magnetic Field", 1993 Dry Process Symposium, Japan, pp. 45–50.

D. Kimura, et al., "Local Etched Profile Anomaly in ECR Prasma Etching", *SEMICONDUCTORS AND INTEGRATED CIRCUITS TECHNOLOGY*, 1995, pp. 91–96.

*Primary Examiner*—Bernard Codd
*Attorney, Agent, or Firm*—Ostrolenk, Faber, Gerb & Soffen LLP

[57] ABSTRACT

A wafer having an interlayer insulating film on a silicon substrate and an Al alloy layer on the interlayer insulating film coated with a resist pattern is introduced into an etching chamber where the Al alloy layer is selectively etched in etchant gas plasma. A main etching process is performed under the etching conditions of a high plasma density until the interlayer insulating film 12 is exposed, and a succeeding over etching process is performed under the etching conditions of a low plasma density. A dry etching method and system is provided which can suppress generation of an abnormal shape or notch of a wiring pattern etched in low pressure and high density plasma, without sacrificing etching selectivity and with productivity being maintained high.

10 Claims, 6 Drawing Sheets

LOAD/UNLOAD

DRY ETCHING SUPPRESSING FORMATION OF NOTCH

BACKGROUND OF THE INVENTION a) Field of the Invention

The present invention relates to a dry etching method and apparatus for patterning a fine conductive wiring layer of a semiconductor integrated circuit or the like by using etchant gas plasma.

b) Description of the Related Art

Wafers for semiconductor integrated circuits are nowadays becoming large in diameter and have finer wiring patterns. In place of batch processing systems which process a plurality of wafers at the same time, single wafer processing systems have been used recently which process one wafer at a time in order to reduce process variations among wafers. For example, in the case of a plasma etching system, it is essential to use a high plasma density in order to ensure practical productivity of a single wafer processing system. From this reason, ECR (electron cyclotron resonance) plasma, helicon wave plasma, inductively coupled plasma, and the like are used for plasma etching systems.

An amount of etching species (active species) in high density plasma is large so that a high etching efficiency is obtained and a productivity higher than that at a low density plasma can be obtained. However, since a high gas pressure is used for a conventional RIE system in order to obtain high density plasma, the mean free path of ions becomes short. Therefore, etching anisotropy is lowered. If high ion energy is used to maintain anisotropy, etching selectivity of resist, underlying insulating layer, and the like is degraded. For realizing both a good productivity and a good etching anisotropy, plasma etching system of low pressure and high density has been developed which can independently control plasma density and ion energy and can maintain high etching anisotropy by lowering ion energy.

However, if polysilicon is etched by using plasma of a low pressure and a high density at a low ion energy, the bottom of a patterned silicon layer near at the interface to the underlying layer is locally side etched and an abnormal shape called a notch is formed. This phenomenon is reported, for example, in the following papers:

(1) N. Fujiwara, et al: Proc. 15th Symp. Dry Process, (1993) 45;
(2) D. Takehara, et al: Proc. 15th Symp. Dry Process, (1993) 51;
(3) N. Fujiwara, et al: Proc. 16th Symp. Dry Process, (19934) 31;
(4) T. Nozawa, et al: Proc. 16th Symp. Dry Process, (1994) 37; and
(5) D. Kimura, et al: Proc. 38th Symp. Semiconductors and Integrated Circuits Technology, pp. 91–96 (1995).

The following facts of the abnormal shape called a notch are known. A notch is formed at an area where fine lines with narrow adjacent spaces are densely distributed (hereinafter called a line and space (L & S) structure). A notch is not formed at the L & S structure having a plurality of lines connected in common, but it is observed at an outer line of an isolated L & S structure. A notch is not observed in the state of just etching but it is observed in the state of over etching. The cause of a notch may be ascribed to disturbance of ion orbits by charge-up of the L & S structure during plasma etching, or to other reasons.

An abnormal shape reported to date is formed in polysilicon during plasma etching at a low pressure and a high density. A similar abnormal shape has also been confirmed when Al alloy is etched at a low pressure and a high plasma density to pattern a fine L & S structure. FIG. 8 shows a test pattern of Al alloy used by notch observation experiments. This test pattern has an L & S structure including wiring patterns (lines) L1, L2, . . . , L7 of 1 $\mu$m width being disposed with a space of 0.8 $\mu$m between each pair of adjacent lines (L/S=1$\mu$m/0.8 $\mu$m). The center wiring pattern L4 is connected to an antenna 84 having a length of about 130 mm and a space of, for example, 10 $\mu$m or wider.

FIG. 9 is a cross sectional view of the wiring structure of FIG. 8 taken along line A–A'. On an insulating film 81 such as a silicon oxide film deposited on a silicon substrate 80, an Al alloy layer 82 is formed on which a resist mask 83 is formed. The substrate 80 is introduced into a plasma etching system and the Al alloy layer 82 is selectively etched to form an L & S structure shown in FIGS. 8 and 9. The etching rate becomes lower at the narrow space than at the broad space. When the underlying insulating film 81 is exposed at the broad space, the Al alloy layer 82 is still left at the narrow space in the L & S structure 86 with dense wiring patterns. If over etching is performed until all the unnecessary Al alloy layer 82 is removed, notches 85 are formed, as shown in FIG. 9, at the bottoms of the wiring pattern L4 connected to the antenna 84 and of the outermost wiring patterns L1 and L7 on the pattern dense side.

Similar notches are also observed when the wiring pattern L4 is connected to the substrate 80 via a contact 87 instead of being connected the antenna, as shown in FIG. 8, and is subjected to etching.

Generation of similar notches is also recognized by any one of plasma etching systems of low pressure and high density, such as an inductively coupled plasma etching system and a microwave plasma etching system (in particular, electron cyclotron resonance (ECR) plasma etching system).

In order to prevent notches, etching may be performed at a plasma density lower than an ordinary case or at a high ion energy with a high plasma density. However, at a low plasma density, the etching rate is lowered. This contradicts the primary object of obtaining high productivity at a high plasma density. Etching anisotropy is degraded at a high pressure. If ion energy is raised in order to maintain high anisotropy, etching selectivity is lowered so that a wiring process margin becomes small, and/or production yield is lowered.

Instead of using a low pressure and high density plasma etching system, a lower plasma density RIE system may be used for effectively preventing notches. Also in this case, however, the etching rate is lower than the low pressure and high density plasma etching system, and high productivity is impossible. If the pressure is raised in order to increase the amount of active etching species, etching anisotropy (directivity) is degraded. If gas such as flon (fuorocarbon) gases easy to form a side wall protection film is added in order to maintain high etching anisotropy, a great amount of reaction byproducts are attached to the inner wall of an etching chamber.

SUMMARY OF THE INVENTION

It is an object of the present invention to provide a dry etching method capable of etching a wiring layer in low pressure and high density plasma while maintaining productivity high and suppressing generation of notches.

It is another object of the invention to provide an etching method capable of maintaining high etching selectivity, providing high productivity and a high etching selection ratio, and suppressing notches.

According to one aspect of the present invention, there is provided a dry etching method comprising the steps of: introducing a wafer into an etching chamber, the wafer having a conductive layer formed over a substrate and a mask pattern formed on the conductive layer; main-etching the conductive layer by dry etching under the etching conditions of a high plasma density until an underlying layer of the conductive layer is exposed; and over-etching the conductive layer to remove the remaining conductive layer under the etching conditions of a lower plasma density than the main-etching step.

According to another aspect of the present invention, there is provided a dry etching method comprising the steps of: introducing a wafer into an etching chamber, the wafer having a conductive layer formed over a substrate and a mask pattern formed on the conductive layer; main-etching the conductive layer under the etching conditions of a low gas pressure and a high plasma density until an underlying layer of the conductive layer is exposed; and over-etching the conductive layer to remove the remaining conductive layer under the etching conditions of a higher gas pressure and a lower plasma density than said main-etching step.

In order to realize the etching conditions of a low plasma density of a plasma etching system, a high frequency power to be applied to an induction coil of an inductively coupled plasma etching system is lowered, a microwave power of a microwave plasma etching system is lowered, or an output of a high frequency power source of a helicon plasma etching system is lowered.

The main etching process may be performed under the etching conditions of a high plasma density and a low self-bias voltage until an underlying layer of the conductive wiring layer is exposed. With this main etching process, high speed etching and excellent selectivity can be realized. The over etching process for completely removing the remaining conductive layer may be performed under the etching conditions of a low plasma density. With this over etching, an abnormal shape called a notch can be prevented from being formed. Generation of notches can be suppressed also by raising ion energy.

In the above manner, a wiring layer can be etched without forming the abnormal shape called a notch, while maintaining high speed etching and large selectivity.

DETAILED DESCRIPTION OF THE PREFERRED EMBODIMENTS

Embodiments of the invention will be described with reference to the accompanying drawings.

Figure 1A:
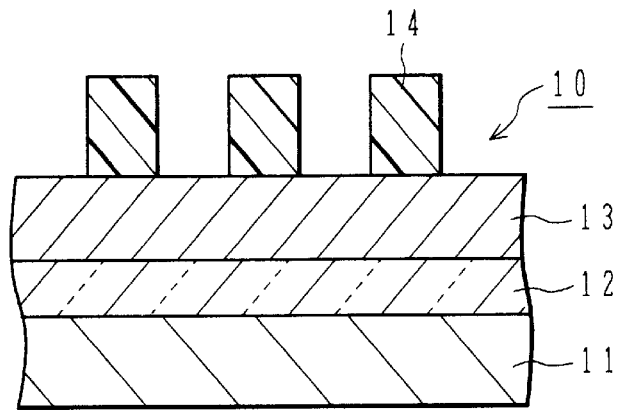
FIGS. 1A to 1C are cross sectional views illustrating wiring pattern forming processes according to an embodiment of the invention.
Figure 1B:
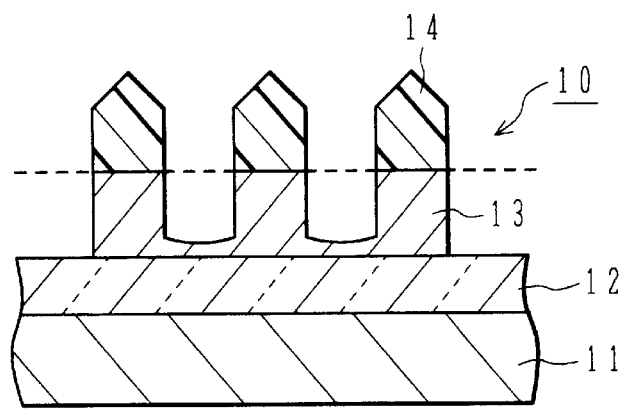
Figure 1C:
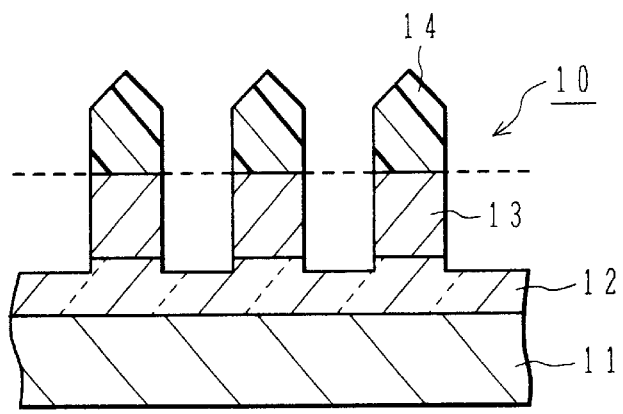

FIGS. 1A to 1C are cross sectional views illustrating wiring pattern forming processes according to the embodiment of the invention. As shown in FIG. 1A, on a silicon substrate 11, an interlayer insulating film 12 such as a silicon oxide film and a silicon nitride film is formed by CVD. After a contact or connection hole (not shown) is formed through the interlayer insulating film 12, an Al alloy wiring layer 13 is deposited on the interlayer insulating film 12. A resist pattern 14 is formed on the wiring layer 13. This wiring layer 13 may be a laminated structure of an Al alloy wiring layer and a barrier layer made of TiN, TiW, silicide of refractory metal (W, Mo, Ti, Ni, and etc.), or the like.

The wafer 10 with the resist pattern is introduced into an etching chamber of a dry etching system to etch the wiring layer 13. Etchant gas is, for example, $Cl_2/BCl_3/CHF_3$. The etching system used will be later described. FIG. 1B shows the state of the wafer 10 after a main etching process. The main etching process is executed under the ordinary etching conditions of a low pressure and a high plasma density. This process is executed until the main portion of the wiring layer 13 is etched and the underlying insulating film 12 is exposed at a broader space area. As shown in FIG. 1B, part of the wiring layer 13 is left unetched at a narrow space area of a dense L & S structure where the etching rate is low and at the step area having a thick wiring layer 13.

After the main etching, an over etching process is performed until the unnecessary wiring layer 13 is completely removed, under the etching conditions of a lower plasma density. FIG. 1C shows the state after this over etching process.

Figure 2:
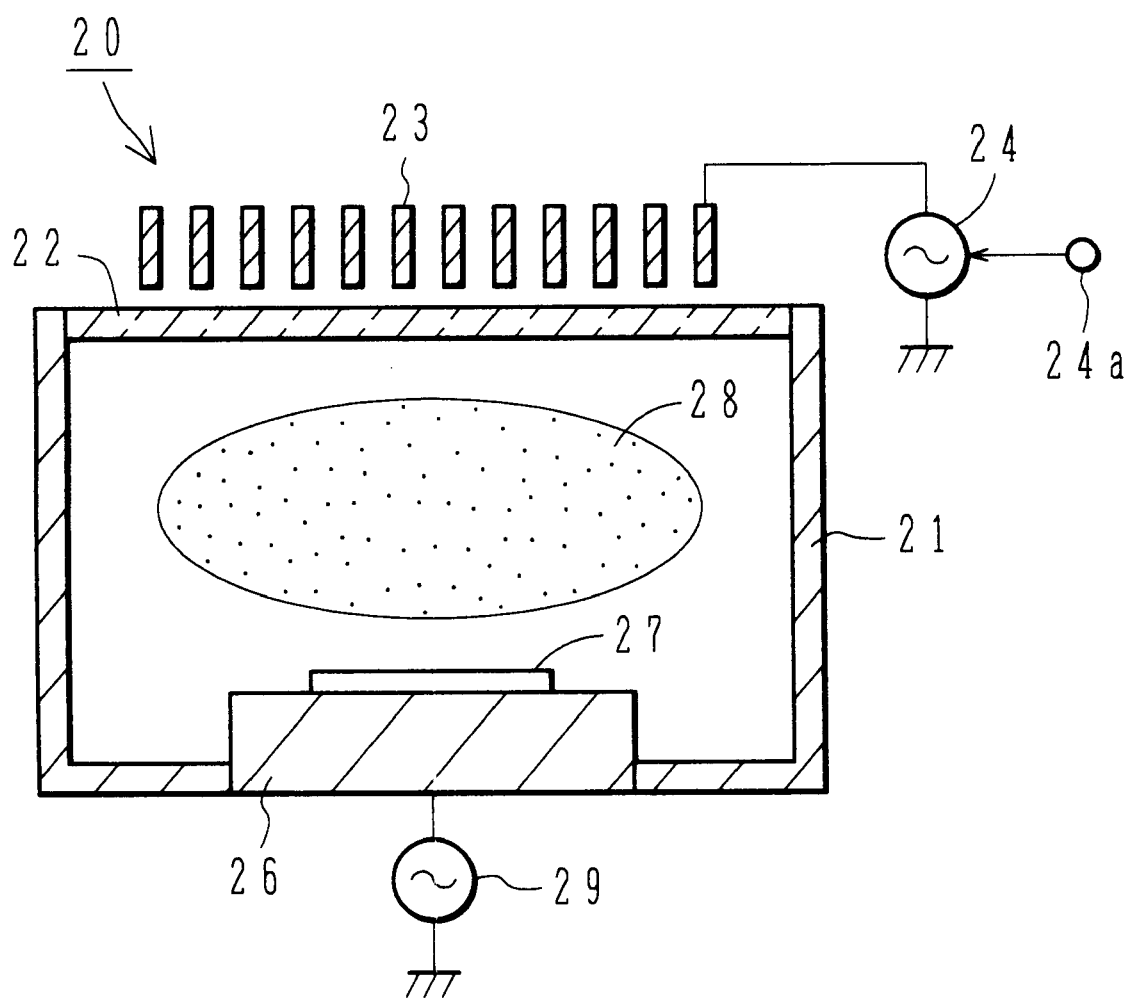
FIG. 2 is a cross sectional view of an inductively coupled plasma etching system used for the embodiment processes.

FIG. 2 shows the structure of an inductively coupled plasma etching system 20 which can generate high density plasma. On a lower electrode/wafer susceptor 26 in an etching chamber 21, a wafer 27 with a resist pattern is placed. On an upper ceramic dielectric plate 22, an induction coil 23 is disposed. This induction coil 23 is supplied with a high frequency power of, for example, 13.56 MHz from a high frequency power source 24. The lower electrode/wafer susceptor 26 is supplied with a high frequency power from a high frequency power source 29 to generate a self-bias voltage. Etchant gas at a predetermined pressure introduced into the chamber 21 discharges in a plasma state by inductive coupling and etches the wafer 27.

The plasma density can be variably controlled by the high frequency power applied to the induction coil 23. Ion energy can be variably controlled by the self-bias voltage.

Figure 3:
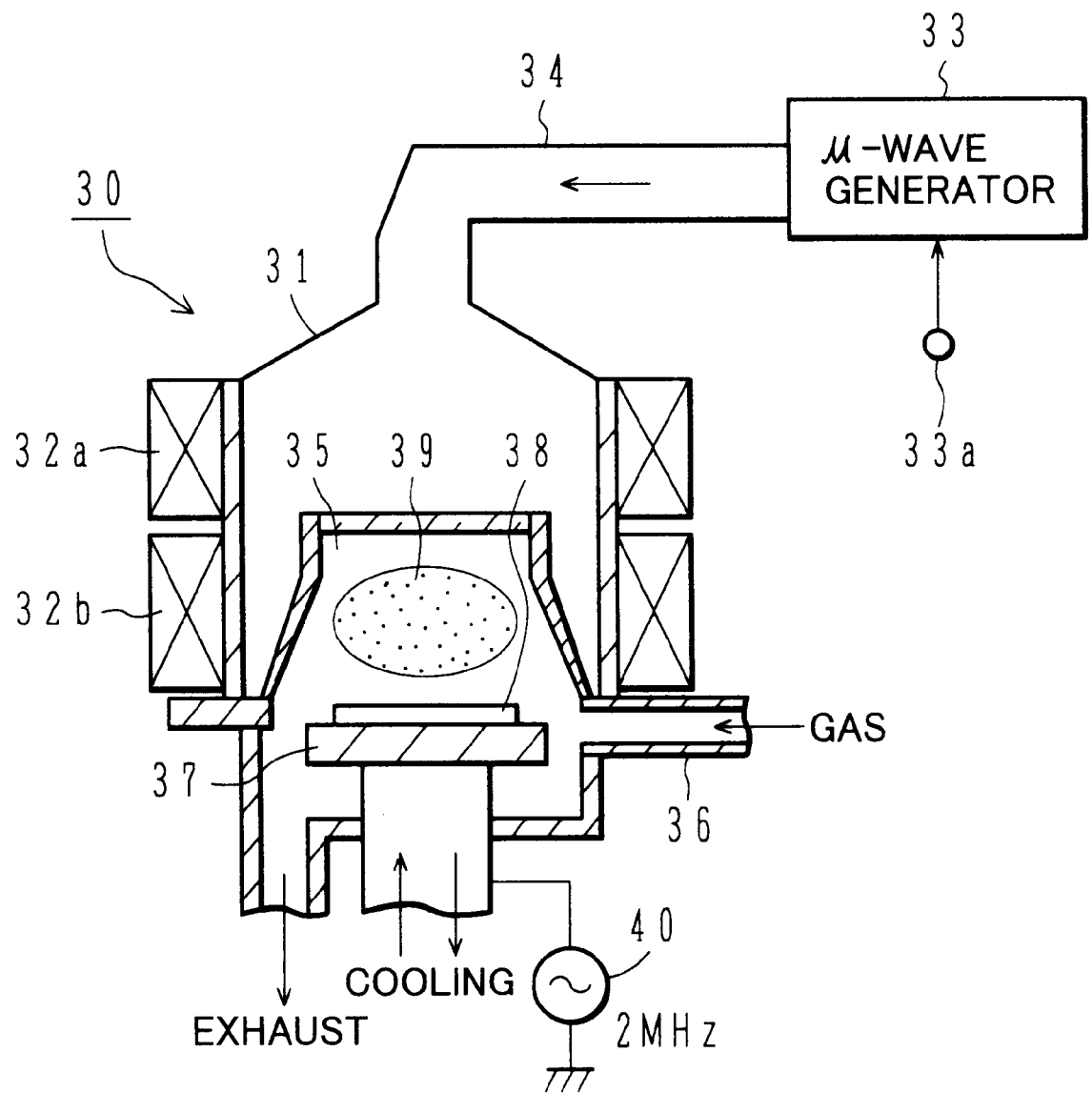
FIG. 3 is a cross sectional view of an ECR plasma etching system used for the embodiment processes.

FIG. 3 shows an ECR plasma etching system 30 as another example of the etching system capable of generating high density plasma. Solenoidal coils 32a and 32b are disposed at the outside of an etching chamber 31. On a lower electrode/wafer susceptor 37 at the bottom of an inner reaction chamber 35, a wafer 38 with a resist pattern is placed. The temperature of the wafer susceptor 37 can be lowered or raised to a desired temperature with coolant. Etchant gas is introduced via a gas pipe 36 into the reaction chamber 35. Microwave of, for example, 2.45 GHz generated by a microwave generator 33 is supplied from the upper portion of the etching chamber 31 via a waveguide 34. A high frequency power of, for example, 2 MHz is supplied from a high frequency power source 40 to the lower electrode/wafer susceptor 37 to generate a self-bias voltage. Plasma 39 is therefore generated in the reaction chamber 39, and active species of the plasma etch the wafer. The plasma density can be variably controlled by regulating the microwave power supplied from the microwave generator 33. Ion energy can be variably controlled by the self-bias voltage.

The main etching process with the above systems is executed under the etching conditions of a low pressure, a high plasma density, and a low ion energy.

The over etching process after the main etching process can use the same system as used by the main etching system. For example, with the system shown in FIG. 2, the over etching process is executed under the etching conditions of a low plasma density with an ion current density of about 2 mA/cm$^2$ or smaller obtained by lowering the applied high frequency power. The gas pressure is a low pressure similar to the main etching, for example, 3 to 20 mTorr.

It was confirmed that when an over etching was done under the conditions of Table 2 to be described later in an inductively coupled plasma etching system, the notch amount reduced to zero when the RF power was 200 W. The ion current density varies linearly with the inductive RF power. The ion current density was obtained as 2.32 mA/cm$^2$.

In this embodiment, therefore, the main etching process is executed by a plasma etching system of low pressure and high plasma density type under the etching conditions of a high plasma density and a low ion energy, and the over etching is executed by the same system under the conditions of a low plasma density, to thereby prevent generation of notches. Since the main etching process is performed under the conditions of a high plasma density, high speed etching is not degraded too much.

Figure 4:
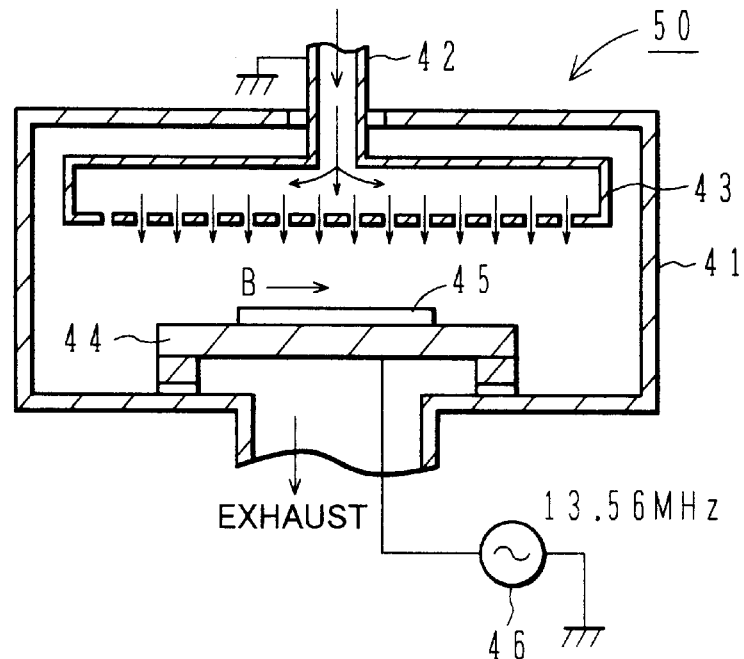
FIG. 4 is a cross sectional view of an RIE system used for the embodiment processes.
Figure 5:
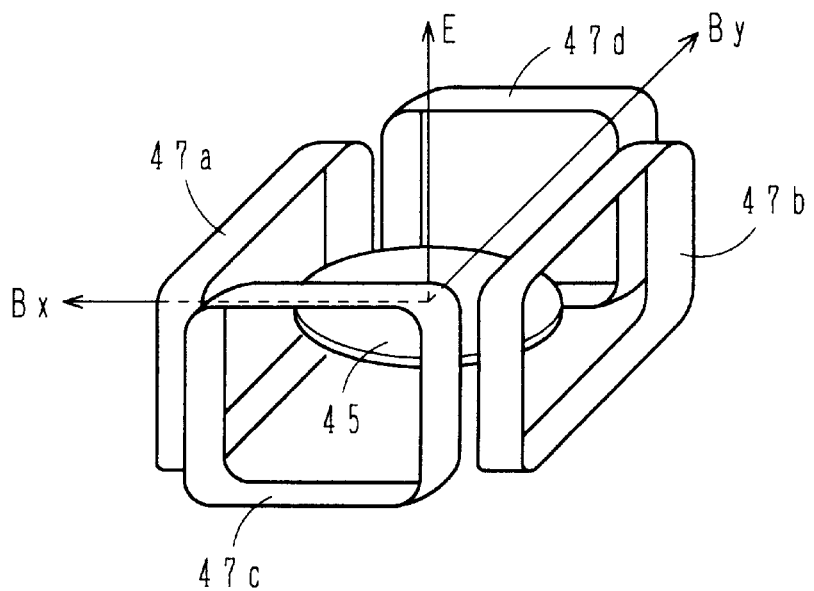
FIG. 5 is a perspective view showing the arrangement of coils of the RIE system.

In this embodiment, the over etching process under the conditions of a low plasma density is executed by using the same system and by changing the plasma density from that of the main etching process. The over etching process may be performed by a different system, e.g. a magnetron RIE system 50 such as shown in FIG. 4. A wafer 45 is placed on a lower electrode/wafer susceptor 44 in an etching chamber 41. Etchant gas supplied from the upper portion via a gas pipe 42 is introduced into the chamber 41 in the form of uniform gas flow via a gas jetting pipe 43 (serving also as an upper electrode) with a number of gas jet nozzles. Tvo pairs of coils 47*a*, 47*b*, 47*c*, and 47*d* such as shown in FIG. 5 are disposed at the outside of the chamber 41 to generate a parallel rotating magnetic field B over the wafer 45. A high frequency power of, for example, 13.56 MHz is applied from a high frequency power source 46 to the wafer susceptor 44. Opposing electrodes are constituted of the wafer susceptor 44 and gas jetting pipe 43 and the etching gas discharges in a plasma state through capacitive coupling. The wafer is etched by active ions excited by plasma. As compared to inductively coupled plasma, capacitively coupled plasma has a lower plasma density.

The main etching process is executed, for example, by the low pressure and high density type plasma etching system shown in FIG. 2 under the conditions of a high plasma density and a low ion energy, and the succeeding over etching process is executed by a high pressure capacitively coupled RIE system such as shown in FIG. 4 under the conditions of a plasma density lower than the main etching process. Also in this way, generation of notches can be prevented.

For the over etching process, a parallel plate RIE system without using a magnetic field may be used instead of a capacitively coupled magnetron RIE system.

Figure 6:
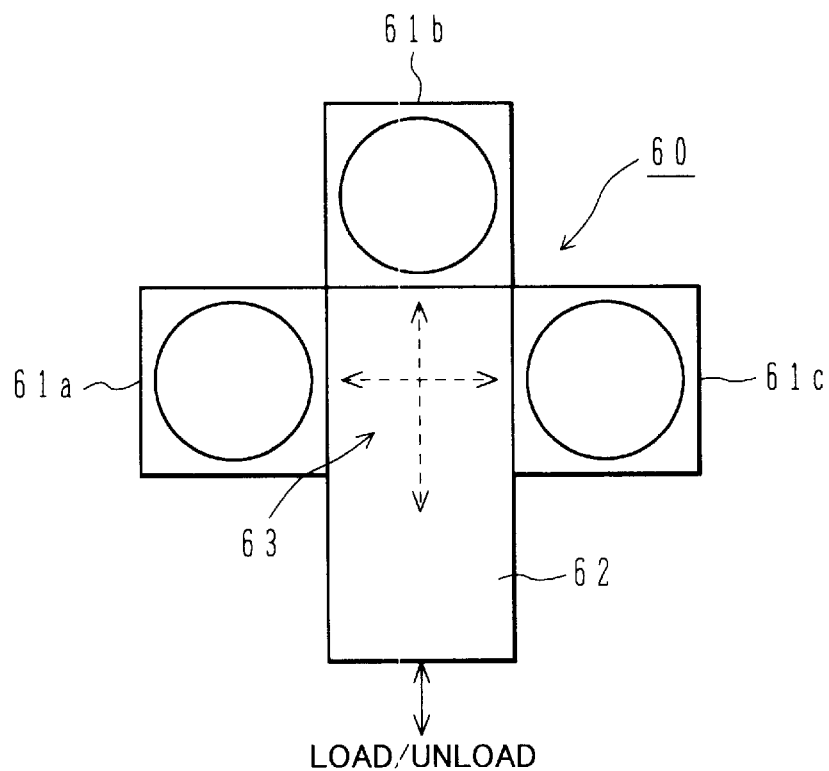
FIG. 6 is a schematic plan view of a multi-chamber type etching system.

FIG. 6 shows another embodiment of the etching system using a multi-chamber type plasma etching system 60. A plurality of etching chambers 61*a* to 61*c* are communicated via an evacuatable wafer transport path 63. A wafer introduced into a wafer load/unload unit can be sequentially transported to and from the plurality of etching chambers, via the wafer transport path without exposing it to the external atmospheric air.

By using this etching system 60, for example, the main etching process is first executed In the etching chamber 61*a* by setting the chamber to the etching conditions of a low pressure and a high plasma density, and the wafer is then transported to the etching chamber 61*b* set to the etching conditions of a lower plasma density to perform the over etching process.

Also in this embodiment, generation of notches can be prevented without degrading high speed etching and etching selectivity.

The advantageous effects of one of the above embodiments will be described by using specific experiment data.

Figure 8:
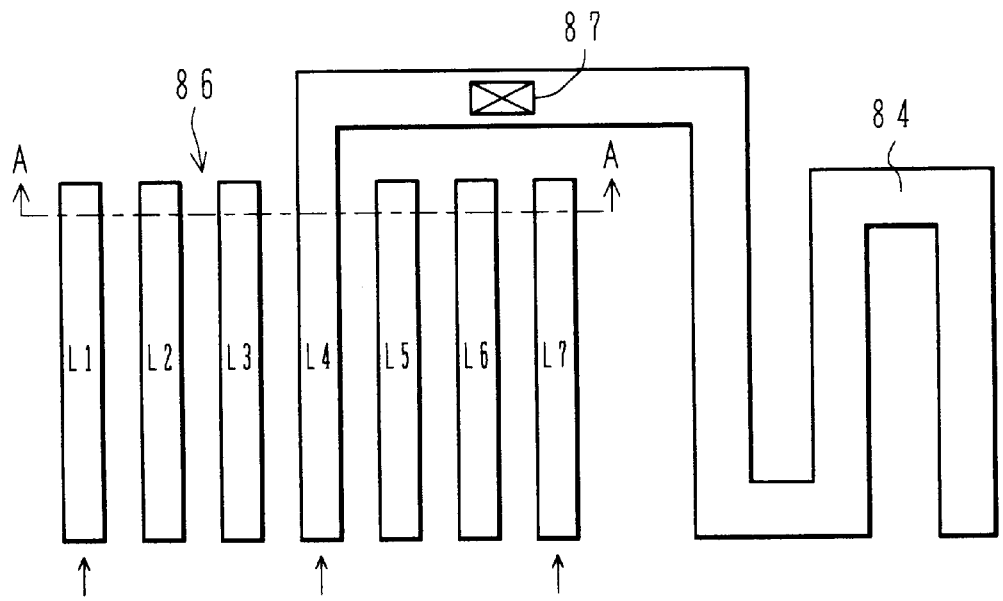
FIG. 8 is a plan view of a test wiring pattern used for experiments.
Figure 9:
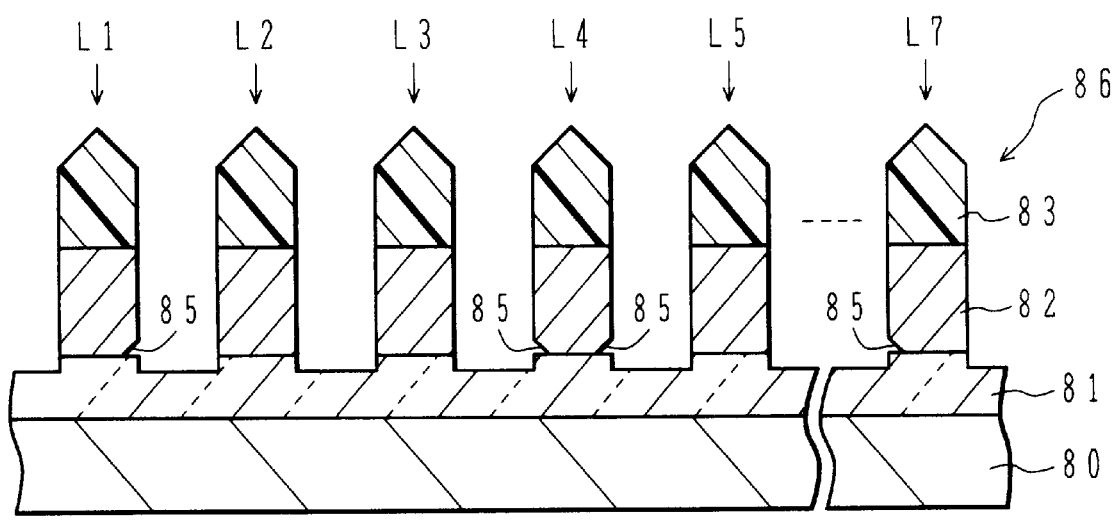
FIG. 9 is a cross sectional view taken along line A–A' of FIG. 8, illustrating a state of generated notches.

A notch amount was measured after an Al alloy layer of 1 μm thick, specifically, an AlSiCu layer, was etched by using the inductively coupled plasma etching system 20 shown in FIG. 2. Test patterns such as shown in FIG. 8 were used.

The conditions of main etching are the same for all test samples, and are shown in Table 1.

TABLE 1

| Inductive | | | Etchant gas | | |
|---|---|---|---|---|---|
| Pressure (mTorr) | RF power (W) | Self-bias (−V) | Cl$_2$ | BCl$_3$ (sccm) | CHF$_3$ |
| 10 | 350 | 100 | 40 | 20 | 3 |

The over etching conditions were set for samples Nos. 1 to 3 as shown in Table 2. The etching time was set so that AlSiCu was able to be etched to a thickness of 630 nm. The ion current densities under the conditions of Table 2 were about 3.7 mA/cm$^2$ for sample No. 1 and about 1.2 mA/cm$^2$ for sample No.3. Although the plasma density was not measured, the ion current density is usually considered to represent the plasma density. In the over etching process, the gas pressure was set at the same value as the main etching process, the self-bias voltage was set at the same value as or at a higher value than the main etching process, and the plasma density was set at the same value as or at a smaller value than the main etching process.

TABLE 2

| | Inductive | | | Etchant gas | | |
|---|---|---|---|---|---|---|
| Test No. | Pressure (mTorr) | RF power (W) | Self-bias (−V) | Cl$_2$ | BCl$_3$ (sccm) | CHF$_3$ |
| 1 | 10 | 350 | 100 | 30 | 50 | 5 |
| 2 | 10 | 350 | 170 | 30 | 50 | 3 |
| 3 | 10 | 100 | 240 | 40 | 67 | 5 |

Figure 7:
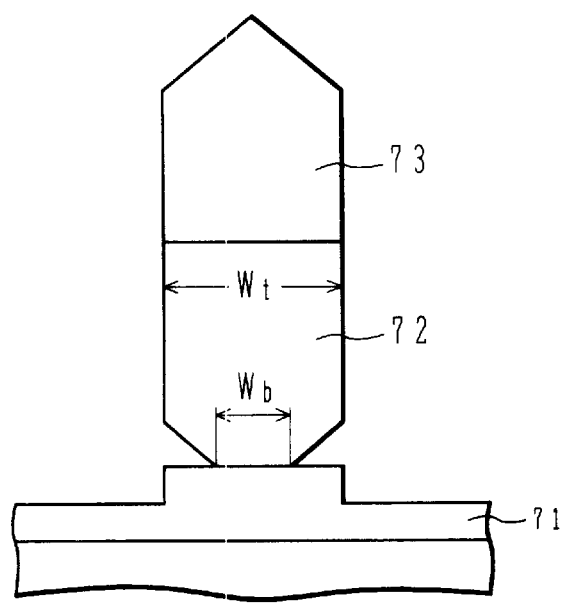
FIG. 7 is a diagram illustrating the definition of a notch amount.

Table 3 shows notch amounts of wiring patterns and resist selection ratios obtained for the test samples. The notch is defined as shown in FIG. 7 by Wt−Wb where Wt is an upper width of an Al alloy wiring layer 72 with a design width of 1.0 μm and Wb is a lower width. The resist selection ratio is a ratio of the etching rate of Al alloy to the etching rate of resist 73.

TABLE 3

| Test No. | Notch Amount (μm) | Resist selection ratio |
|---|---|---|
| 1 | 0.55 | 2.46 |
| 2 | 0.29 | 1.4 |
| 3 | 0 | 3.17 |

The following evaluation is possible from the above measurement results. In the over etching process, the of a high plasma density and a low ion energy as in sample No. 1 result in a large notch amount, whereas the condition of a low plasma density and a high ion energy as in sample No. 3 result in a reduced notch amount and a resist selection ratio maintained high. The measurement results of sample No. 2 show a reduced notch amount under the conditions of a high self-bias voltage and hence a high ion energy with the plasma density being maintained high. Although an etching selection ratio of Al alloy to resist lowers, this is not serious if the over etching time is shortened. It can be expected that notches are suppressed also by lowering the plasma density.

In the above description, an Al alloy wiring layer is etched. The invention is also effective for etching other conductive layers such as a polysilicon layer, a refractory metal layer, and a refractory metal silicide layer.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A dry etching method comprising the steps of:
    introducing a wafer into an etching chamber, the wafer having a conductive layer formed over a substrate and a mask pattern formed on the conductive layer and etching the wafer with an etching method consisting essentially of a main etching step and an over-etching step;
    said main-etching step consisting essentially of main-etching the conductive layer by anisotropically dry etching under the etching conditions of a first plasma density and a first ion energy until an unmasked portion of the conductive layer is removed; and
    said over-etching step consisting essentially of anisotropically over-etching the unmasked portion of the conductive layer to remove the remaining unmasked portion of the conductive layer under the etching conditions of a second plasma density and a second ion energy, the second plasma density being a lower plasma density than said first plasma density in said main-etching step and said second ion energy being a higher energy than said first ion energy in said main-etching step and said second plasma density and said second ion energy being such as to eliminate notch-generation in the conductive layer.

2. A dry etching method according to claim 1, wherein said over-etching step is performed in a same etching chamber as used by said main-etching step.

3. A dry etching method according to claim 1, wherein said over-etching step is performed in an etching chamber different from an etching chamber used by said main-etching step.

4. A dry etching method according to claim 3, further comprising a step of transporting the wafer between the different etching chambers via an evacuated transport path.

5. A method of fabricating a semiconductor device, comprising the steps of:
    a) providing a substrate;
    b) forming an aluminum alloy layer over the substrate;
    c) forming a resist mask pattern over the aluminum alloy layer;
    d) anisotropically etching the aluminum alloy layer through an etching method consisting essentially of first and second sub-steps, wherein the first sub-step is conducted under the etching conditions of a first plasma density and a first ion energy and the second sub-step is conducted under the etching conditions of a second plasma density and a second ion energy, the second plasma density being a lower plasma density than said first plasma density in said first sub-step and said second ion energy being a higher energy than the first ion energy in said second sub-step and said second plasma density and said second ion energy being such as to eliminate notch-generation in the aluminum alloy layer.

6. The method according to claim 5, wherein an insulating layer is provided under the aluminum alloy layer.

7. The method according to claim 6, wherein the first sub-step is done until main portions of the aluminum alloy layer is removed and the insulating layer is exposed at a broader space area while a part of the aluminum alloy layer is left unetched at the narrower space area, and the second sub-step is done until the aluminum alloy layer is completely removed.

8. The method according to claim 5, wherein the anisotropically etching step is done in an inductively coupled plasma etching apparatus.

9. The method according to claim 5, wherein the anisotropically etching step is done in an electron cyclotron resonance plasma etching apparatus.

10. A dry etching method comprising the steps of:
    introducing a wafer into an RF etching chamber, the wafer having a conductive layer formed over a substrate and a mask pattern formed on the conductive layer and etching the wafer with an etching method consisting essentially of a main-etching step and an over-etching step;
    said main-etching step consisting essentially of main-etching the conductive layer by anisotropically dry etching under the etching conditions of a first RF power level to generate a first plasma density and a first dc bias to provide a first ion energy until an unmasked portion of the conductive layer is removed; and
    said over-etching step consisting essentially of anisotropically over-etching the unmasked portion of the conductive layer to remove the remaining unmasked portion of the conductive layer under the etching conditions of a second RF power level and a second dc bias, the second RF power level being lower than the first RF power level so that the second plasma density is a lower plasma density than said first plasma density in said main-etching step and said second dc bias having an absolute value higher than the absolute value of said first dc bias so that said second ion energy is a higher energy than said first ion energy in said main-etching step, said absolute value of said second dc bias having a value such as to eliminate notch-generation in the conductive layer.

* * * * *